(12) United States Patent
Sakaguchi

(10) Patent No.: US 6,535,011 B1
(45) Date of Patent: Mar. 18, 2003

(54) TESTING DEVICE AND TESTING METHOD FOR A SEMICONDUCTOR INTEGRATED CIRCUIT AND STORAGE MEDIUM HAVING THE TESTING PROGRAM STORED THEREIN

(75) Inventor: Hideaki Sakaguchi, Tenri (JP)

(73) Assignee: Sharp Kabushiki Kaisha, Osaka (JP)

( * ) Notice: Subject to any disclaimer, the term of this patent is extended or adjusted under 35 U.S.C. 154(b) by 176 days.

(21) Appl. No.: 09/621,586

(22) Filed: Jul. 21, 2000

(30) Foreign Application Priority Data

Jul. 23, 1999 (JP) .......................................... 11-208470
Jul. 11, 2000 (JP) ...................................... 2000-209193

(51) Int. Cl.$^7$ ............................................. G01R 31/02
(52) U.S. Cl. ........................ 324/763; 324/210; 324/211
(58) Field of Search ................................ 324/555, 602, 324/605, 608, 612, 111, 312, 210, 211, 763; 364/487; 371/15.1, 22.1, 22.4, 24, 25.1; 714/734, 735, 736; 702/118, 108

(56) References Cited

U.S. PATENT DOCUMENTS 5,473,619 A    12/1995  Sakaguchi
5,751,735 A  * 5/1998   Tobin ........................ 371/22.5
5,771,240 A  * 6/1998   Tobin ........................ 371/22.1
5,953,684 A  * 9/1999   Alexander ................. 702/108

FOREIGN PATENT DOCUMENTS

JP           9312569 A     12/1997

* cited by examiner

Primary Examiner—Michael Sherry
Assistant Examiner—Trung Nguyen
(74) Attorney, Agent, or Firm—Birch, Stewart, Kolasch & Birch, LLP

(57) ABSTRACT

A testing device tests a LCD driver LSI which incorporates a multiple number of D/A converters and outputs voltages from the D/A converters via associated output terminals. A voltage meter measures a multiple levels of tonal voltages output from the first output terminal and calculates the differential voltage value between each measured voltage and the associated expected voltage. Each differential amplifier has an input for receiving the output voltage output from the first output terminal in common and another input for receiving the output voltage output from one output terminal other than the first output terminal. A comparator receives the amplified differential voltages output from the plural differential amplifiers and checks whether the amplified differential voltages from the differential amplifiers fall within given voltage ranges, receptively.

23 Claims, 8 Drawing Sheets

US 6,535,011 B1

TESTING DEVICE AND TESTING METHOD FOR A SEMICONDUCTOR INTEGRATED CIRCUIT AND STORAGE MEDIUM HAVING THE TESTING PROGRAM STORED THEREIN

BACKGROUND OF THE INVENTION (1) Field of the Invention

The present invention relates to a testing device and a testing method for a semiconductor integrated circuit (e.g., a LCD driver IC, etc.) that incorporates a multiple number of D/A converters and outputs voltages from the D/A converters via the associated output terminals as well as a storage medium having the testing program stored therein. In particular, the present invention relates to a testing device, a testing method and a storage medium having the testing program stored therein, which enable very quick and highly precise test of the output voltages from the D/A converters.

(2) Description of the Prior Art

With the development of LCD panels into a high precision configuration, LCD driver LSIs incorporated in LCD panels have become developed to handle a greater number of outputs and a greater number of tones. For such tonal display, each output circuit in the LCD driver LSI incorporates an individual D/A converter to output a tonal voltage. For example, a 6 bit D/A converter can display 64 levels of tones while a 8 bit D/A converter can display 256 levels of tones.

Upon the test for such a LCD driver LSI, it is checked if all the tonal voltage levels output from individual D/A converters fall within respective correct (pass) ranges, as shown in FIG. 1.

FIG. 2 is a conceptual view illustrating a conventional testing method by using a test example of a LCD driver LSI 51 incorporating 'm' outputs.

A semiconductor testing device (tester) 52 is used to supply an input signal to LCD driver LSI 51 so that each incorporated D/A converter (not shown) outputs a voltage level corresponding to the first tonal level. The voltage levels corresponding to the first tonal level are output from associated output terminals (output 1, ..., output m) of LCD driver LSI 51 and supplied to input terminals (V) of tester 52. In tester 52, matrix switches (not shown) are sequentially turned on and off so that the output voltages corresponding to the first tonal level are sequentially measured from the first output to the m-th output, one by one, using a high accuracy analog voltage measuring device (not shown) incorporated in the tester. The measured results are sequentially stored in an incorporated data memory (not shown). This process is repeated by the number of tonal levels until all pieces of data (m outputs) for all tonal levels (n levels) are stored into the memory. As a result, m×n pieces of data will be stored into the memory. The data stored in this memory is subjected to a series of logical and arithmetical operations through an unillustrated processing unit incorporated in tester 52 so as to check each tonal voltage of each output.

In such a test of a LCD driver LSI 51, with the development towards a greater number of outputs and a greater number of tones, the amount of data to be picked up and the time required for data processing have increase, so that the testing time increases sharply. Further, increase of the tonal levels in number will make the potential difference between adjacent tonal voltage levels smaller, requiring a greater precision for measuring the voltages of all the tonal levels, which results in a further longer time for testing.

Since, with the thus development towards a greater number of outputs and a greater number of tones, the conventional testing method should handle an increased amount of data and perform very high-accurate voltage measurements for all the tonal output voltages, the testing time has become markedly longer and the test cost has increased sharply.

SUMMARY OF THE INVENTION

The present invention has been completed in view of the above prior art situation, and it is therefore an object of the present invention to provide a testing device, a testing method and a storage medium having the testing program stored therein, which enable very quick and highly precise test of semiconductor integrated circuits.

In order to achieve the above object, the present invention is configured as follows:

In accordance with the first aspect of the present invention, a testing device for a semiconductor integrated circuit which incorporates a multiple number of D/A converters and outputs voltages from the D/A converters via associated output terminals, includes:

a voltage measuring means for measuring the special output voltage corresponding to each tonal level output from a special output terminal of a special D/A converter and computing the difference between the special output voltage and the associated expected voltage as a special differential voltage;

differential amplifying means which, for each tone, receives the special output voltage and output voltages from the output terminals other than the special output terminal and calculates differential voltages and outputs the amplified differential voltages; and a comparing and determining means for determining whether the amplified differential voltages output from the differential amplifying means fall within a determination voltage range which is specified in accordance with the special differential voltage dependent on each tone.

In accordance with the second aspect of the present invention, the testing device for a semiconductor integrated circuit, having the above first feature is characterized in that the number of differential amplifying means is equal to the number of the output terminals other than the special output terminal, each of the differential amplifying means has an input for receiving a corresponding output voltage output from one of the output terminals other than the special output terminal and another input for receiving the special output voltage in common, and the comparing and determining means effects simultaneous judgement as to all the amplified differential voltages output from the differential amplifying means.

In accordance with the third aspect of the present invention, the testing device for a semiconductor integrated circuit, having the above first or second feature is characterized in that the upper and lower limit voltage values that specify the determination voltage range is set up by shifting the standard upper and lower limit voltage values which are given previously in conformity with the expected voltage value by a fixed value that corresponds to the special differential voltage value.

In accordance with the fourth aspect of the present invention, a testing method for a semiconductor integrated circuit which incorporates a multiple number of D/A converters and outputs voltages from the D/A converters via associated output terminals, includes the steps of:

measuring the special output voltage corresponding to each tonal level output from a special output terminal of a special D/A converter and computing the difference between the special output voltage and the associated expected voltage as a special differential voltage;

for each tone, receiving the special output voltage and output voltages from the output terminals other than the special output terminal, calculating differential voltages and outputting the amplified differential voltages; and determining whether the amplified differential voltages output from the differential amplifying means fall within a determination voltage range which is specified in accordance with the special differential voltage dependent on each tone.

In accordance with the fifth aspect of the present invention, a testing method for a semiconductor integrated circuit which incorporates a multiple number of D/A converters and outputs voltages from the D/A converters via associated output terminals, includes the steps of:

measuring the special output voltage corresponding to each tonal level output from a special output terminal of a special D/A converter and computing the difference between the special output voltage and the associated expected voltage as a special differential voltage;

for each tone, receiving the special output voltage and output voltages from the output terminals other than the special output terminal, calculating differential voltages and outputting the amplified differential voltages; and for determining whether the amplified differential voltages output from the differential amplifying means fall within a determination voltage range which is specified in accordance with the special differential voltage dependent on each tone, receiving the amplified differential voltages corresponding to associated output terminals in parallel and effecting simultaneous judgement as to whether all the amplified differential voltages fall within the determination voltage range.

In accordance with the sixth aspect of the present invention, the testing method for a semiconductor integrated circuit, having the above fourth or fifth feature, is characterized in that the upper and lower limit voltage values that specify the determination voltage range are set up by shifting the standard upper and lower limit voltage values which are given previously in conformity with the expected voltage value by a fixed value that corresponds to the special differential voltage value.

In accordance with the seventh aspect of the present invention, the testing method for a semiconductor integrated circuit, having the above sixth feature, further includes the steps of:

determining whether the special output voltage falls within the standard voltage range specified by the upper and lower standard voltage values;

regarding the semiconductor integrated circuit as a defective when the special output voltage falls out of the standard voltage range; and regarding the semiconductor integrated circuit as a non-defective if the amplified deferential voltages fall within the determination voltage range while regarding the semiconductor integrated circuit as a defective if any of the amplified deferential voltages falls out of the determination voltage range, in the case where the special differential voltage falls within the standard voltage range.

In accordance with the eighth aspect of the present invention, the testing method for a semiconductor integrated circuit, having the above fourth feature is characterized in that, even when the upper and lower limit values of the determination voltage range varies as the tonal level output from the terminals of the semiconductor integrated circuit is switched from one to another, the width of the determination voltage range is constant.

In accordance with the ninth aspect of the present invention, the testing method for a semiconductor integrated circuit, having the above fifth feature is characterized in that, even when the upper and lower limit values of the determination voltage range varies as the tonal level output from the terminals of the semiconductor integrated circuit is switched from one to another, the width of the determination voltage range is constant.

In accordance with the tenth aspect of the present invention, the testing method for a semiconductor integrated circuit, having the above sixth feature is characterized in that, even when the upper and lower limit values of the determination voltage range varies as the tonal level output from the terminals of the semiconductor integrated circuit is switched from one to another, the width of the determination voltage range is constant.

In accordance with the eleventh aspect of the present invention, the testing method for a semiconductor integrated circuit, having the above seventh feature is characterized in that, even when the upper and lower limit values of the determination voltage range varies as the tonal level output from the terminals of the semiconductor integrated circuit is switched from one to another, the width of the determination voltage range is constant.

In accordance with the twelfth aspect of the present invention, the testing method for a semiconductor integrated circuit, having the above seventh feature is characterized in that the width of the determination voltage range is narrowed stepwise until the device under test is determined as a defective.

In accordance with the thirteenth aspect of the present invention, the testing method for a semiconductor integrated circuit, having the above twelfth feature is characterized in that semiconductor integrated circuits under test are classified into ranks, based on the variations of the output voltages in the determination voltage range when each device under test was determined as a defective.

The fourteenth aspect of the present invention resides in a storage medium having a testing program stored therein for testing a semiconductor integrated circuit, which enables execution of a testing method for a semiconductor integrated circuit which incorporates a multiple number of D/A converters and outputs voltages from the D/A converters via associated output terminals, comprising the steps of:

measuring the special output voltage corresponding to each tonal level output from a special output terminal of a special D/A converter and computing the difference between the special output voltage and the associated expected voltage as a special differential voltage;

for each tone, receiving the special output voltage and output voltages from the output terminals other than the special output terminal, calculating differential voltages and outputting the amplified differential voltages; and determining whether the amplified differential voltages output from the differential amplifying means fall within a determination voltage range which is specified in accordance with the special differential voltage dependent on each tone.

The fifteenth aspect of the present invention resides in a storage medium having a testing program stored therein for testing a semiconductor integrated circuit, which enables execution of a testing method for a semiconductor integrated circuit which incorporates a multiple number of D/A converters and outputs voltages from the D/A converters via associated output terminals, comprising the steps of:

measuring the special output voltage corresponding to each tonal level output from a special output terminal of a special D/A converter and computing the difference between the special output voltage and the associated expected voltage as a special differential voltage;

for each tone, receiving the special output voltage and output voltages from the output terminals other than the special output terminal, calculating differential voltages and outputting the amplified differential voltages; and for determining whether the amplified differential voltages output from the differential amplifying means fall within a determination voltage range which is specified in accordance with the special differential voltage dependent on each tone, receiving the amplified differential voltages corresponding to associated output terminals in parallel and effecting simultaneous judgement as to whether all the amplified differential voltages fall within the determination voltage range.

The sixteenth aspect of the present invention resides in the storage medium having the fourteenth or fifteenth feature for having a testing program stored therein for testing a semiconductor integrated circuit, which enables execution of a testing method wherein the upper and lower limit voltage values that specify the determination voltage range are set up by shifting the standard upper and lower limit voltage values which are given previously in conformity with the expected voltage value by a fixed value that corresponds to the special differential voltage value.

The seventeenth aspect of the present invention reside in that storage medium having the above sixteenth feature for having a testing program stored therein for testing a semiconductor integrated circuit, which enables execution of the testing method, which further comprises the steps of:

determining whether the special output voltage falls within the standard voltage range specified by the upper and lower standard voltage values;

regarding the semiconductor integrated circuit as a defective when the special output voltage falls out of the standard voltage range; and regarding the semiconductor integrated circuit as a non-defective if the amplified deferential voltages fall within the determination voltage range while regarding the semiconductor integrated circuit as a defective if any of the amplified deferential voltages falls out of the determination voltage range, in the case where the special differential voltage falls within the standard voltage range.

The eighteenth aspect of the present invention resides in the storage medium having the above fourteenth feature for having a testing program stored therein for testing a semiconductor integrated circuit, which enables execution of a testing method wherein, even when the upper and lower limit values of the determination voltage range varies as the tonal level output from the terminals of the semiconductor integrated circuit is switched from one to another, the width of the determination voltage range is constant.

The nineteenth aspect of the present invention resides in the storage medium having the above fifteenth feature for having a testing program stored therein for testing a semiconductor integrated circuit, which enables execution of a testing method wherein, even when the upper and lower limit values of the determination voltage range varies as the tonal level output from the terminals of the semiconductor integrated circuit is switched from one to another, the width of the determination voltage range is constant.

The twentieth aspect of the present invention resides in the storage medium having the above sixteenth feature for having a testing program stored therein for testing a semiconductor integrated circuit, which enables execution of a testing method wherein, even when the upper and lower limit values of the determination voltage range varies as the tonal level output from the terminals of the semiconductor integrated circuit is switched from one to another, the width of the determination voltage range is constant.

The twenty-first aspect of the present invention resides in the storage medium having the above seventeenth feature for having a testing program stored therein for testing a semiconductor integrated circuit, which enables execution of a testing method wherein, even when the upper and lower limit values of the determination voltage range varies as the tonal level output from the terminals of the semiconductor integrated circuit is switched from one to another, the width of the determination voltage range is constant.

The twenty-second aspect of the present invention resides in the storage medium having the above seventeenth feature for having a testing program stored therein for testing a semiconductor integrated circuit, which enables execution of a testing method wherein the width of the determination voltage range is narrowed stepwise until the device under test is determined as a defective.

The twenty-third aspect of the present invention resides in the storage medium having the above twenty-secondth feature for having a testing program stored therein for testing a semiconductor integrated circuit, which enables execution of a testing method wherein semiconductor integrated circuits under test are classified into ranks, based on the variations of the output voltages in the determination voltage range when each device under test was determined as a defective.

According to the testing device and testing method for a semiconductor integrated circuit of the present invention, first, the voltage measuring means highly precisely measures the voltage values of plural tonal vantages output from a special D/A converter via the special output terminal corresponding thereto and computes the differential voltage value (digital value) between each measured voltage and the associated expected voltage. This differential voltage value is stored into the memory incorporated in the tester. The output voltages from the D/A converters via the output terminals other than the above special terminal are compared with the output voltage from the special D/A converter by the differential amplifiers. The comparison results, in other words, the amplified differential voltages from the differential amplifiers are supplied to the comparing and determining means (comparator). The comparator determines whether the amplified differential voltages from the differential amplifiers fall within a given voltage range (the determination voltage range). The upper and lower limit voltage values that specify the determination voltage range is set up by shifting the standard upper and lower limit voltage values, which have been set for the case where the tonal voltage output from the special output terminal is equal to the expected voltage, by a voltage value that corresponds to the above differential voltage value. Thus, the upper and lower limit voltages, based on which voltage comparison is to be made, can be modified in accordance with the deviation, of each tonal level voltage output from the special D/A converter, from the associated expected voltage. Therefore, it is possible to effect the test for each tonal level voltage correctly.

According to the testing device and testing method for semiconductor integrated circuits of the present invention, testing of a semiconductor integrated circuit such as a LCD driver LSI which has been developed to handle a greater number of outputs and a greater number of tones can be carried out by simultaneous judgements of all the amplified differential voltages in the comparator in combination with high-precision voltage measurement only on the output voltage from the special D/A converter via the special output terminal. Therefore, it is possible to markedly reduce the testing time as well as to sharply reduce the testing cost. Further, the differential amplification of the differential amplifiers (amplification of the differential voltage of each input from the special input by a predetermined amplification factor (e.g., 100 times, or greater)) promotes high precision in the comparing operation of the subsequent comparator, thus enabling highly precise testing.

DESCRIPTION OF THE PREFERRED EMBODIMENTS

The present invention will hereinafter be described in detail with reference to the embodiments of the invention.

The First Embodiment

Figure 1:
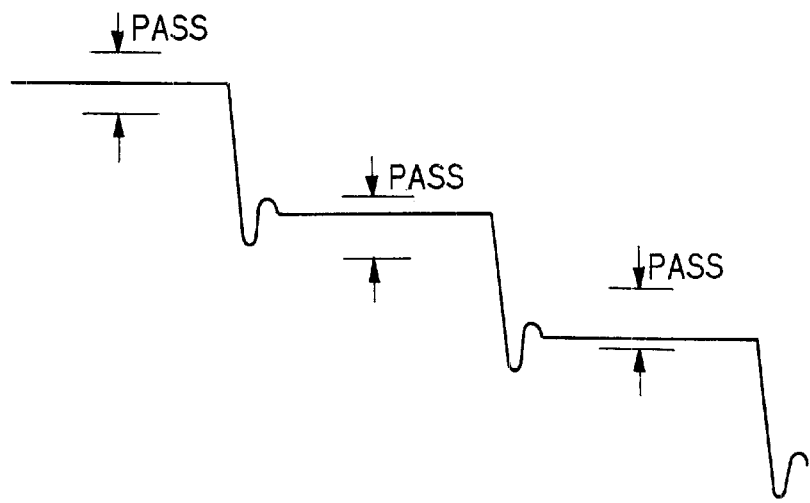
FIG. 1 is a voltage waveform chart for illustrating a conventional testing device.
Figure 2:
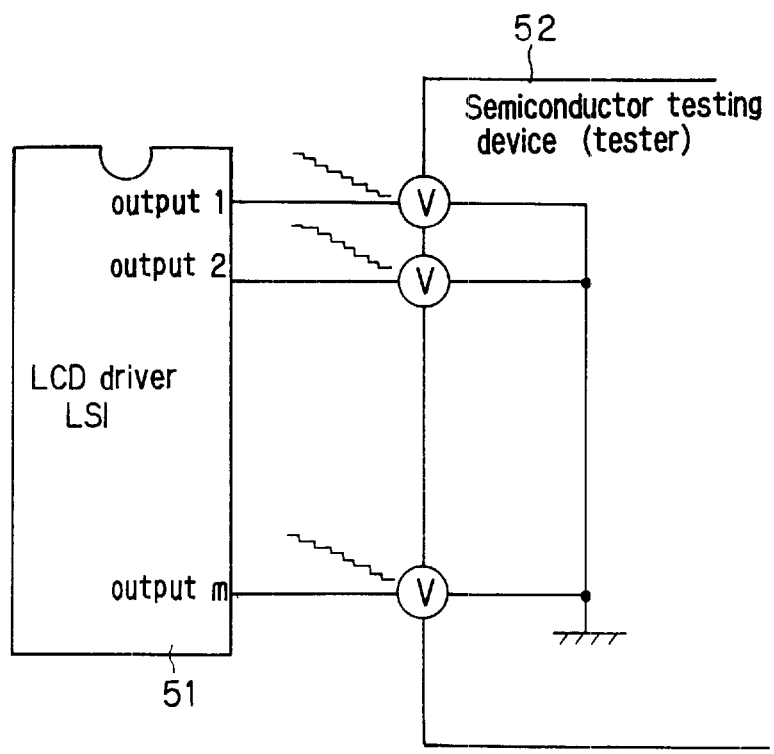
FIG. 2 is a diagram showing a configuration of a conventional testing device.
Figure 3:
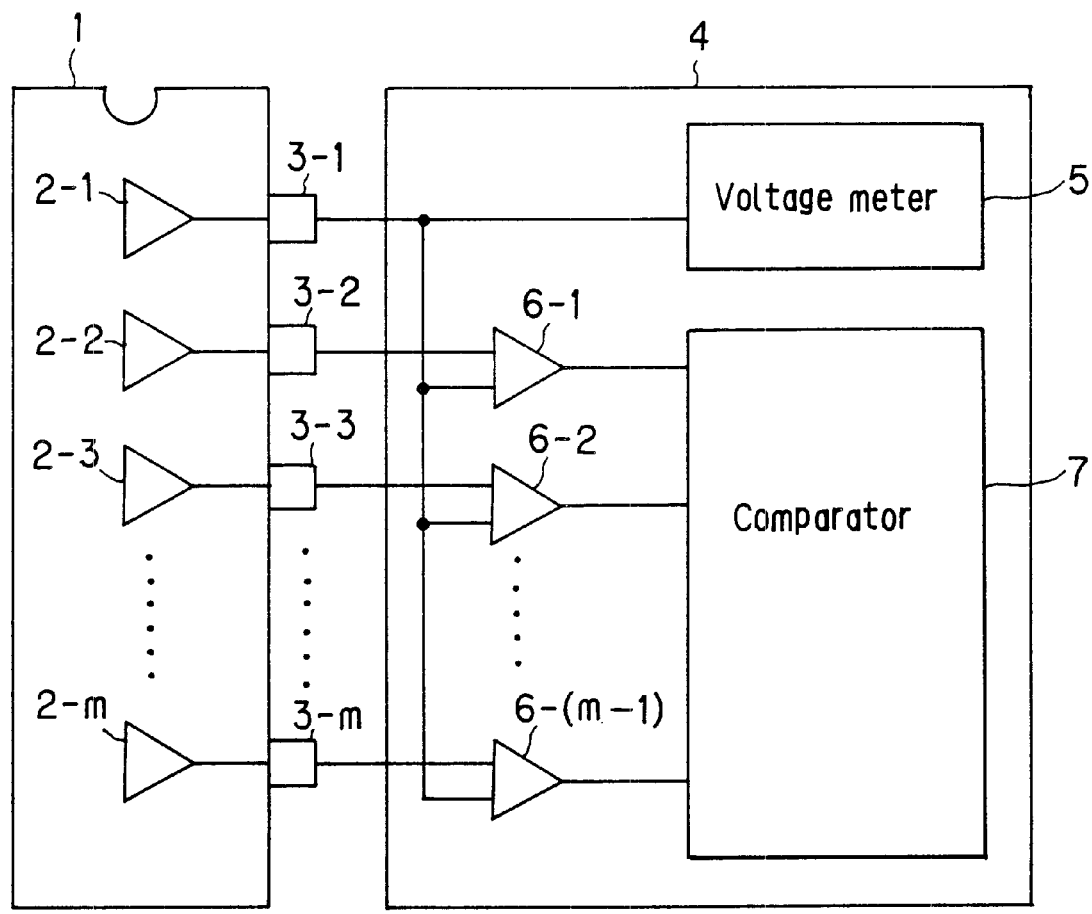
FIG. 3 is a block diagram showing the first embodiment of a LCD driver LSI testing device in accordance with the present invention.
Figure 4:
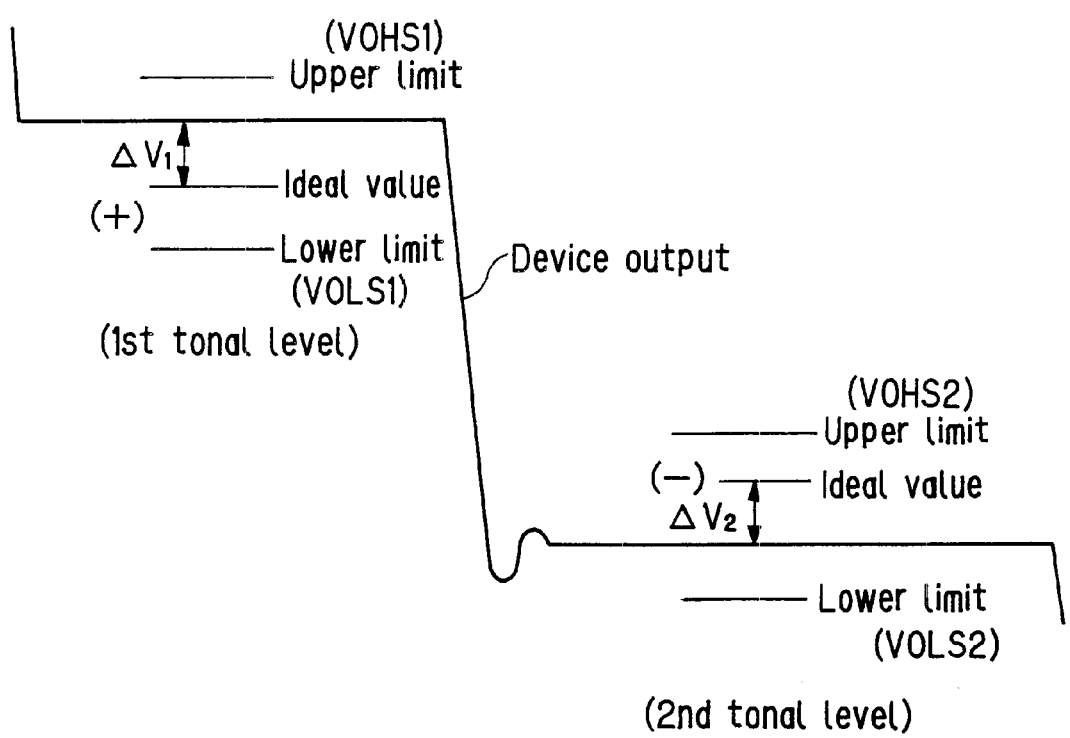
FIG. 4 is a voltage waveform chart for illustrating the operation of the first embodiment.

FIG. 3 is a block diagram showing a configuration of a LCD driver LSI testing device in accordance with the first embodiment of the present invention. FIG. 3 is a block diagram showing a case where a LCD driver LSI made up of an m-output, n-tonal semiconductor integrated circuit is tested. FIG. 4 is a voltage waveform chart for illustrating the operation of the testing device shown in FIG. 3.

A LCD driver LSI 1 has m output terminals 3-1 through 3-m. Output terminals 3-1 through 3-m are connected to the output terminals of respective D/A converters 2-1 through 2-m incorporated in LCD driver LSI 1. Each D/A converter 2-1 through 2-m outputs a tonal voltage of n-levels of tones.

D/A converter 2-1 is adapted to serve as a special D/A converter, and outputs a special output voltage (special tonal voltage) from its output terminal, i.e., the first output terminal 3-1. This special tonal voltage is input to a high-precision voltage meter 5 provided in a tester 4 as the testing device. N-levels of special tonal voltages are sequentially output from first output terminal 3-1 and their voltage values are measured with high precision by voltage meter 5 and output digitally. Then, for each tone, the difference between the special tonal voltage value (digital value) and the ideal value (expected voltage value: digital value) is computed (e.g., $\Delta V1$, $\Delta V2$, etc., in FIG. 4). These special differential voltage values are adapted to be stored in an unillustrated memory provided in tester 4.

The tonal voltage output from each of the output terminals, the second to m-th output terminals 3-2 to 3-m is input to one input terminal of associated differential amplifier 6-1 through 6-(m−1). The special tonal voltage of each level output from the first output terminal 3-1 is commonly input to the remaining input terminals of differential amplifiers 6-1 through 6-(m−1). Each differential amplifier 6-1 through 6-(m−1) amplifies the differential voltage between the tonal voltage output from the associated output terminal (one of the second to m-th output terminals 3-2 to 3-m) and the tonal voltage output from the first output terminal 3-1 by a predetermined amplification factor (e.g., 100 times or greater) and outputs the amplified differential voltage. This amplification of the differential voltage contributes to providing high precision in the comparative determination in the subsequent comparator.

The amplified differential voltages output from differential amplifiers 6-1, . . . 6-(m−1) are input to a comparator 7 provided in tester 4. This comparator 7 is a comparing and determining means and simultaneously determines if all the amplified differential voltages supplied from differential amplifiers 6-1 through 6-(m−1) fall within a given voltage range and outputs a signal representing the determined result. That is, this comparator 7 outputs a determination signal which represents either that all the input voltages fall within the given voltage range or that any of the input voltages falls out of the given voltage range.

Figure 5:
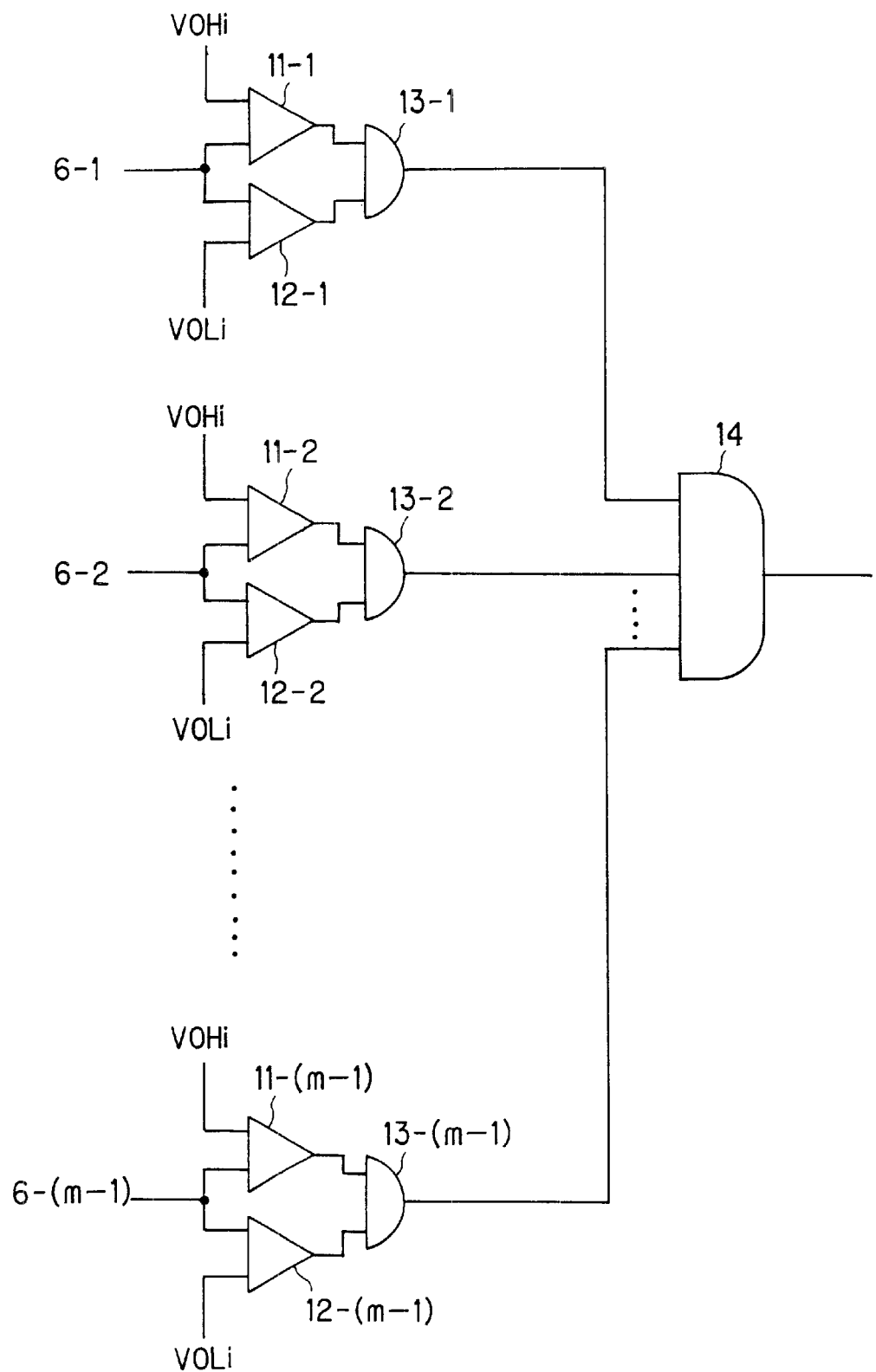
FIG. 5 is a circuit diagram showing a circuit configuration of a comparator of the first embodiment.

FIG. 5 shows the circuit configuration of this comparator 7. In FIG. 5, components 11-1 and 12-1, through 11-(m−1) and 12-(m−1) are voltage comparators while components 13-1 through 13-(m−1) and 14 are AND circuits. VOHi(i=1 to n) are upper limit voltages each designating the upper limit of the associated given voltage range. VOLi(i=1 to n) are lower limit voltages each designating the lower limit of the associated given voltage range.

Each of voltage comparators 11-1 through 11-(m−1) compares the amplified differential voltage from associated amplifier 6-1 through 6-(m−1) with the aforementioned upper limit voltage VOHi. If the former is lower than the latter, the comparator outputs the H-level signal while it outputs the L-level signal if the former is higher than the latter.

Similarly, each of voltage comparators 12-1 through 12-(m−1) compares the amplified differential voltage from the associated amplifier with the aforementioned lower limit voltage VOLi. If the former is higher than the latter, the comparator outputs the H-level signal while it outputs the L-level signal if the former is lower than the latter.

In the above configuration, if all the amplified differential voltages supplied from differential amplifiers 6-1 through 6-(m−1) fall within the given voltage range, AND circuit 14 will output the H-level signal. If any of the amplified differential voltage falls out of the given voltage range, AND circuit 14 will output the L-level signal.

The above upper limit voltage value VOHi and lower limit voltage value VOLi in this comparator 7 are set up based on the standard upper limit voltage value VOHSi (i=1 to n) and the standard lower limit voltage value VOLSi (i=1 to n), which have been determined beforehand for each tonal level. That is, the standard upper limit voltage value VOHSi (i=1 to n) and the standard lower limit voltage value VOLSi (i=1 to n) have been previously set as shown in FIG. 4 in accordance with the ideal value for each tone, and the range specified by these standard upper and lower limit voltage values is referred to as the standard voltage range. Upper limit voltage value VOHi and lower limit voltage value VOLi are obtained by modifying VOHSi and VOLSi as follows:

$$VOHi=VOHSi \pm \Delta Vi \cdot \text{(amplication factor of the differential amplifier)}$$

$$VOLi=VOLSi+\Delta Vi \cdot \text{(the amplication factor of the differential amplifier)}.$$

The range specified by upper limit voltage value VOHi and lower limit voltage value VOLi is referred to as the determination voltage range. Here, the standard upper limit voltage values as well as the standard lower limit voltage values may be set in common for all the tonal voltages (all the tonal voltages from the tonal voltage corresponding to the first tonal level to that corresponding to the n-th tonal level).

Since the width of the determination voltage range is constant, the determination voltage of comparator 7 for determining the amplified differential voltage remains constant, needing no complicated setup.

Figure 6:
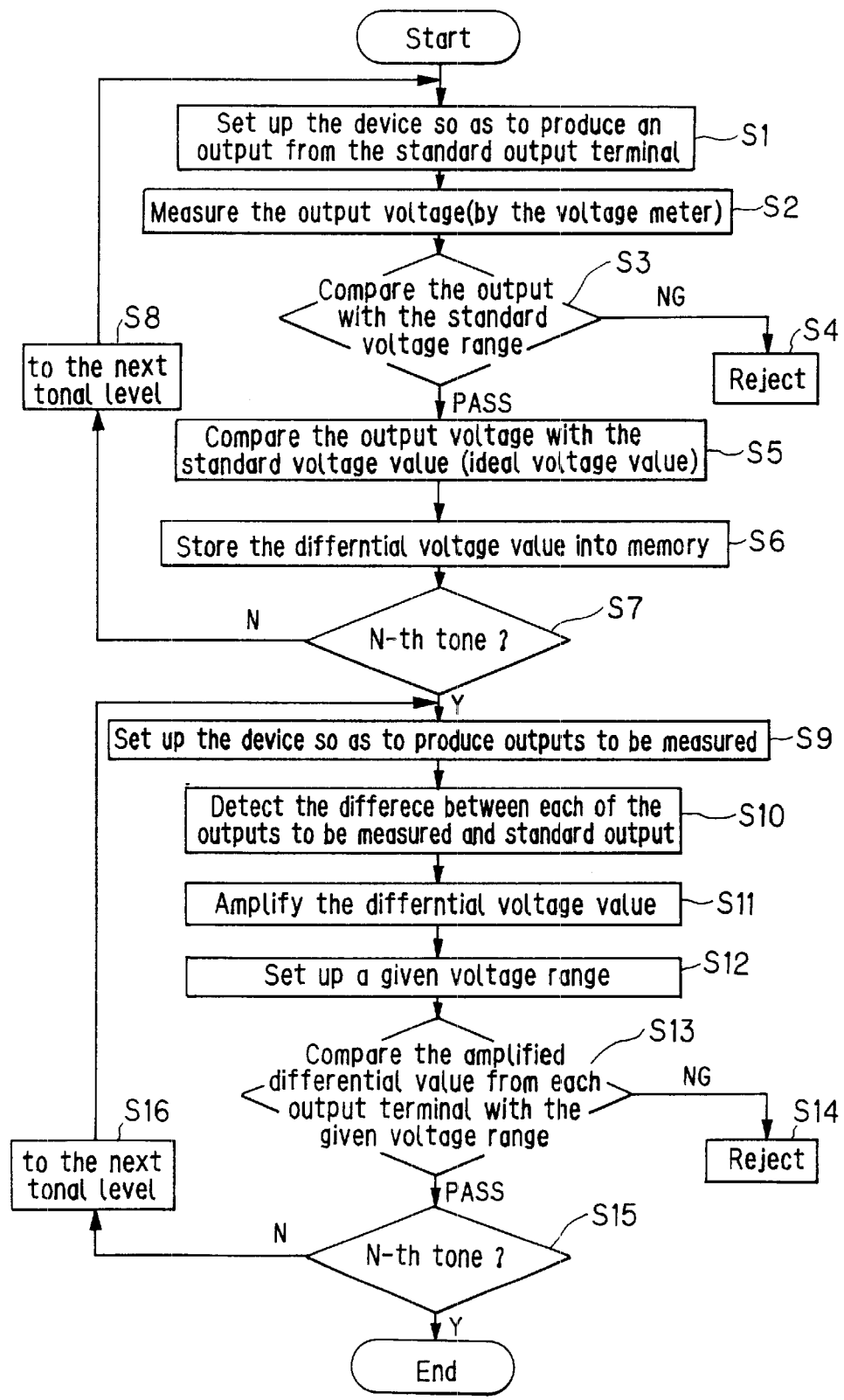
FIG. 6 is a flowchart showing the testing operation with a testing device of the first embodiment.

Next, the operation of this testing device will be described. FIG. 6 is a flowchart showing the testing operation by this testing device.

To begin with, LCD driver LSI 1 is set and operated so that the tonal voltage representing the first tone is output from the first output terminal 3-1 (S1). The special tonal voltage output from the first output terminal 3-1 is input to voltage meter 5 of tester 4, where the voltage is measured (S2). In this measuring procedure, it is checked whether the special tonal voltage value falls within the standard voltage range (S3). If the special tonal voltage value is determined out of the standard voltage range, the testing operation is stopped at that point so that the LSI under test is rejected as a defective (S4).

If the special tonal voltage value is determined to fall within the standard voltage range, the difference (the measured value—the ideal value) between the measured voltage value and the ideal value of the special tonal voltage of the first tonal level is computed (S5). The result ($\Delta V1$) is stored into memory (S6). Then, it is checked if the measurement is for the n-th tone (S7) and then the next cycle of this sequence is continued until the operation reaches the n-th level (S8). When the measurement reaches the nth tonal level of voltage, the operation goes to the next sequence, where the tonal voltages output from the second output terminal 3-2 through the m-th output terminal 3-m are checked. This is carried out as follows.

LCD driver LSI 1 is operated so as to output the tonal voltage representing the first tone from all the output terminals 3-1 through 3-m (S9). The tonal voltage output from the first output terminal 3-1 is commonly supplied to the input terminals on one side of all the differential amplifiers 6-1 through 6-(m−1) while the tonal voltages output from the second terminal 3-2 to m-th output terminal 3-m are input to the remaining, respective input terminals to associated differential amplifiers 6-1 through 6-(m−1). Each of differential amplifiers 6-1 through 6-(m−1), based on the input voltage, detects the difference between the tonal voltage representing the first tone, output from the associated output terminal (i.e., the second and later terminals) from LCD driver LSI 1 and the special tonal voltage of the first tone output from the first output terminal (S10), and amplifies the detected differential voltage by a given magnification (e.g., 100 times or greater)) (S11). The thus amplified differential voltages are supplied in parallel to comparator 7 of tester 4.

Upper and lower limit voltage values VOH1 and VOL1 that define the determination voltage range are set as follows (S12). That is, the differential voltage ($\Delta V1$) between the special voltage measurement and the ideal value of the special tonal voltage of the first tonal level is read out from the memory so as to set up the upper and lower limit voltage values VOH1 and VOL1, respectively.

$$VOH1=VOHS1-\Delta Vi \cdot \text{(amplification factor of the differential amplifier)}$$

$$VOL1=VOLS1-\Delta V1 \cdot \text{(amplification factor of the differential amplifier)}.$$

In comparator 7, it is checked if each amplified differential voltage falls within the above determination voltage range (S13). When comparator 7 produces the L-level output from AND circuit 14, which means any of the output voltages is determined to fall out of the above determination voltage range, the testing operation is stopped at that point so that the LSI under test is rejected as a defective (S14). When AND circuit 14 produces the H-level output, which means that all the output voltages are judged to fall within the determination voltage range, it is checked whether the measurement reaches the n-th tone (S15). In this case, the operation goes to the test for the tonal voltages of the second tonal level because it has not reached the n-th tone (S16).

Next, LCD driver LSI 1 is operated so as to output the tonal voltage representing the second tone from all the output terminals 3-1 through 3-m (S9). The tonal voltage output from the first output terminal 3-1 is commonly supplied to the input terminals on one side of each of differential amplifiers 6-1 through 6-(m−1) while the tonal voltages output from the second terminal 3-2 to m-th output terminal 3-m are input to the remaining, respective input terminals to associated differential amplifiers 6-1 through 6-(m−1). Each of differential amplifiers 6-1 through 6-(m−1), based on the input voltage, detects the difference between the tonal voltage representing the second tone, output from the associated output terminal (i.e., the second and later terminals) from LCD driver LSI 1 and the special tonal voltage of the second tone output from the first output terminal (S100), and amplifies the detected differential voltage by a given magnification (e.g., 100 times or greater)) (S11). The thus amplified differential voltages ate supplied in parallel to comparator 7 of tester 4.

Upper and lower limit voltage values VOH2 and VOL2 that define the determination voltage range are set as follows (S12). That is, the differential voltage ($\Delta V2$) between the special voltage measurement and the ideal value of the special tonal voltage of the second tonal level is read out from the memory so as to set up the upper and lower limit voltage values VOH2 and VOL2, respectively.

$$VOH2=VOHS2-\Delta V2 \cdot \text{(amplification factor of the differential amplifier)}$$

$$VOL2=VOLS2-\Delta V2 \cdot \text{(amplification factor of the differential amplifier)}.$$

In comparator 7, it is checked if each amplified differential voltage falls within the above determination voltage range (S13). When comparator 7 produces the L-level output from AND circuit 14, which means any of the output voltages is determined to fall out of the above determination voltage range, the testing operation is stopped at that point so that the LSI under test is rejected as a defective (S14). When AND circuit 14 produces the H-level output, which means that all the output voltages are judged to fall within the determination voltage range, it is checked whether the measurement reaches the n-th tone (S15). In this case, the operation goes to the test for the tonal voltages of the third tonal level because it has not reached the n-th tone (S16).

The same test will be repeated until the test on the n-th tonal voltage is completed. Thus, it is possible to check all the tonal voltages output from individual D/A converters incorporated in the LCD driver LSI.

In the above embodiment, the special tonal voltage output from the first output terminal is used as the standard voltage, but it is needless to say that the tonal voltage output from any other output terminal can be used as the special tonal voltage.

The Second Embodiment

Figure 7:
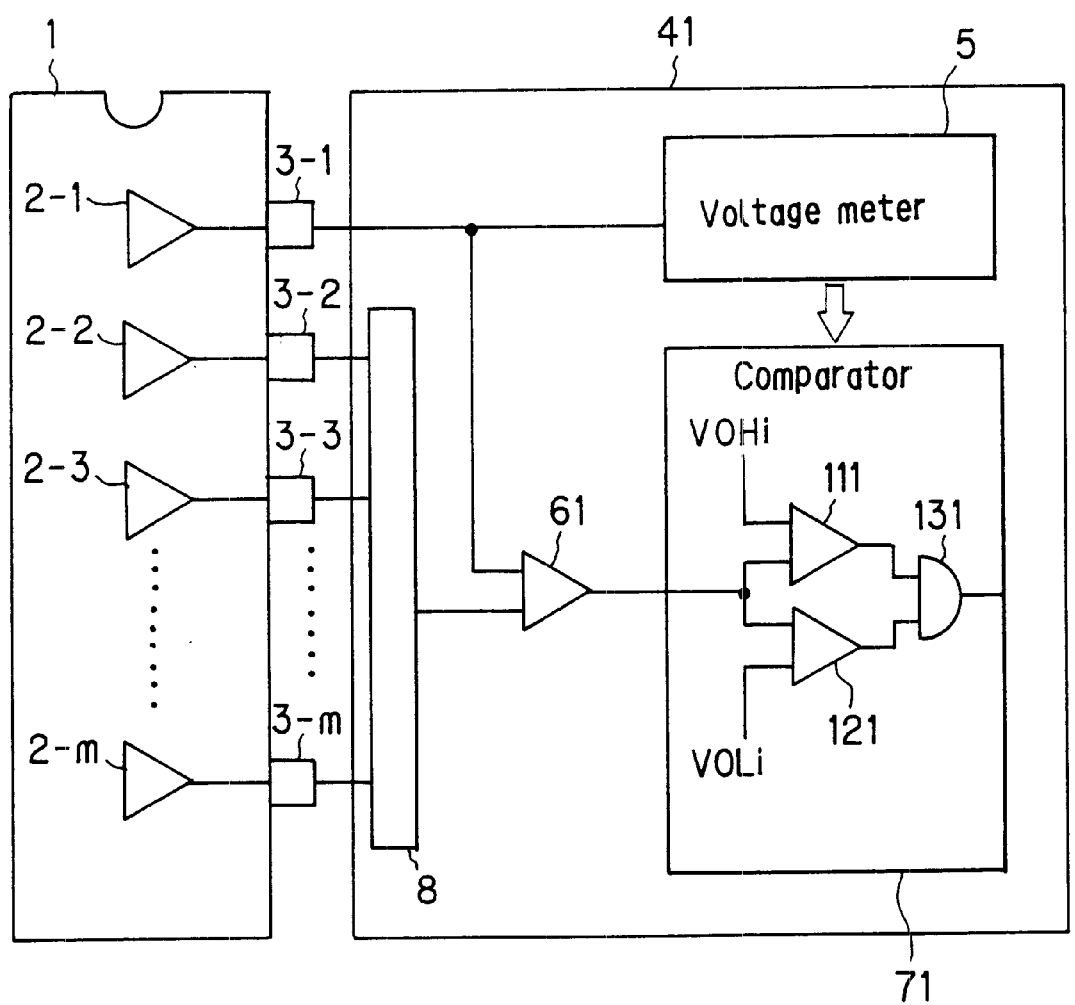
FIG. 7 is a block diagram showing the second embodiment of a LCD driver LSI testing device in accordance with the present invention.

FIG. 7 is a block diagram showing the second embodiment of a LCD driver LSI testing device in accordance with the present invention. This testing device 41, instead of using (m−1) differential amplifiers, is configured of a single differential amplifier 61 and a comparator 71 including a pair of voltage comparators 111 and 121 and a single AND circuit 131, and an input switching circuit 8 interposed between each of the second to m-th output terminals 3-2 through 3-m and differential amplifier 61, as shown in FIG. 7. In this arrangement, input switching circuit 8 is operated so as to enable differential amplifier 61 to effect sequential comparing operations. In this case, when AND circuit 131 produces the L-level output, the test is stopped at that point, and the LSI under test is rejected as a defective. When the AND circuit has continuously produced the H-level output, from the test on the second output terminal up to that on the m-th output terminal, the LSI under test is determined as non-defective. The number of differential amplifiers may be any number greater than one and not greater than (m−2).

The Third Embodiment

The testing device in the third embodiment has the same configuration as the first embodiment, but the testing method is different. The tonal voltages output from the LCD driver having a multiple number of D/A converters shown in FIG. 3 present voltage deviations $\Delta V_1$, $\Delta V_2$ from the associated ideal voltages as shown in the tonal voltage waveform chart (FIG. 4). These deviations in output voltage occur from individuality of the D/A converters in the LCD driver. Detecting the amount of voltage deviation also takes an important role in the LCD driver test.

In the conventional scheme, all the levels of the tonal voltages are first determined by the high-precision analog voltage meter and these values are subjected to the predetermined arithmetic operation in the tester so as to determine the variations in voltage. According to this embodiment, the differential voltages output from differential amplifiers 6-1 through 6-(m−1) are input to comparator 7 as shown in FIG. 3, where each input can be always compared with constant voltages VH and VL set therein. In this embodiment, when the levels of these VH and VL are adapted to be varied individually, it is possible to detect the level on the VH side at which the device under test will translate from the pass to the reject and the level on the VL side at which the device under test will translate from the pass to the reject to thereby determine the voltage difference therebetween.

Now a specific example will be described referring to actual numerals.

Figure 8:
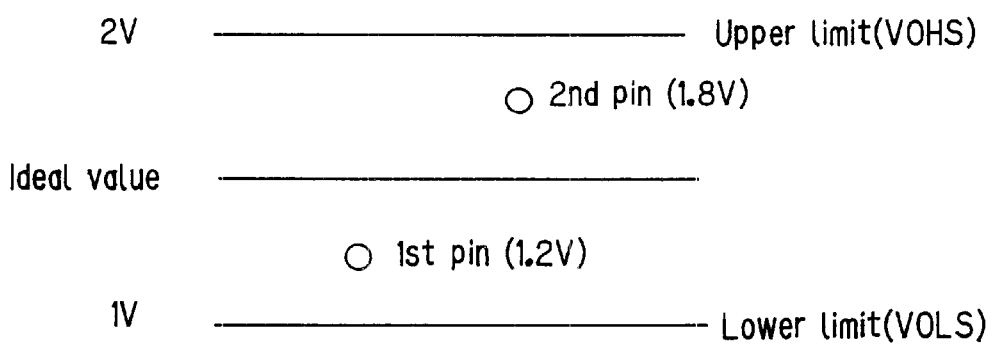
FIG. 8 is an illustrative view for illustrating the determination by varying the upper and lower limits in accordance with the third embodiment.

In the testing method of the third embodiment, VOH and VOL with respect to the ideal value are set 2 V and 1 V, respectively, as shown in FIG. 8, and it is checked whether all the outputs fall within this range. The present embodiment enables a further detailed evaluation of the devices.

First, VOH is varied from 2 V with decrements of 0.1 V, for example, so as to detect the point at which the device under test becomes rejected. That is, the maximum value or the farthest value from the ideal value among all the pins becomes the 'reject' point, and suppose pin 2 shown in FIG. 8 has the maximum value, VOH=1.80 V is determined as the 'reject' point.

In a similar manner, VOL is varied from 1 V with increments of 0.1 V so as to detect the point at which the device under test becomes rejected. In this case, the minimum value or the farthest value from the ideal value among all the pins becomes the 'reject' point, and suppose pin 1 shown in FIG. 8 has the minimum value, VOH=1.20V is determined as the 'reject' point.

The range from VOL=1.2 V to VOH=1.8 V detected here represents the variation among all the pins and the devices can be ranked, or their usage can be classified according to this value.

Figure 9:
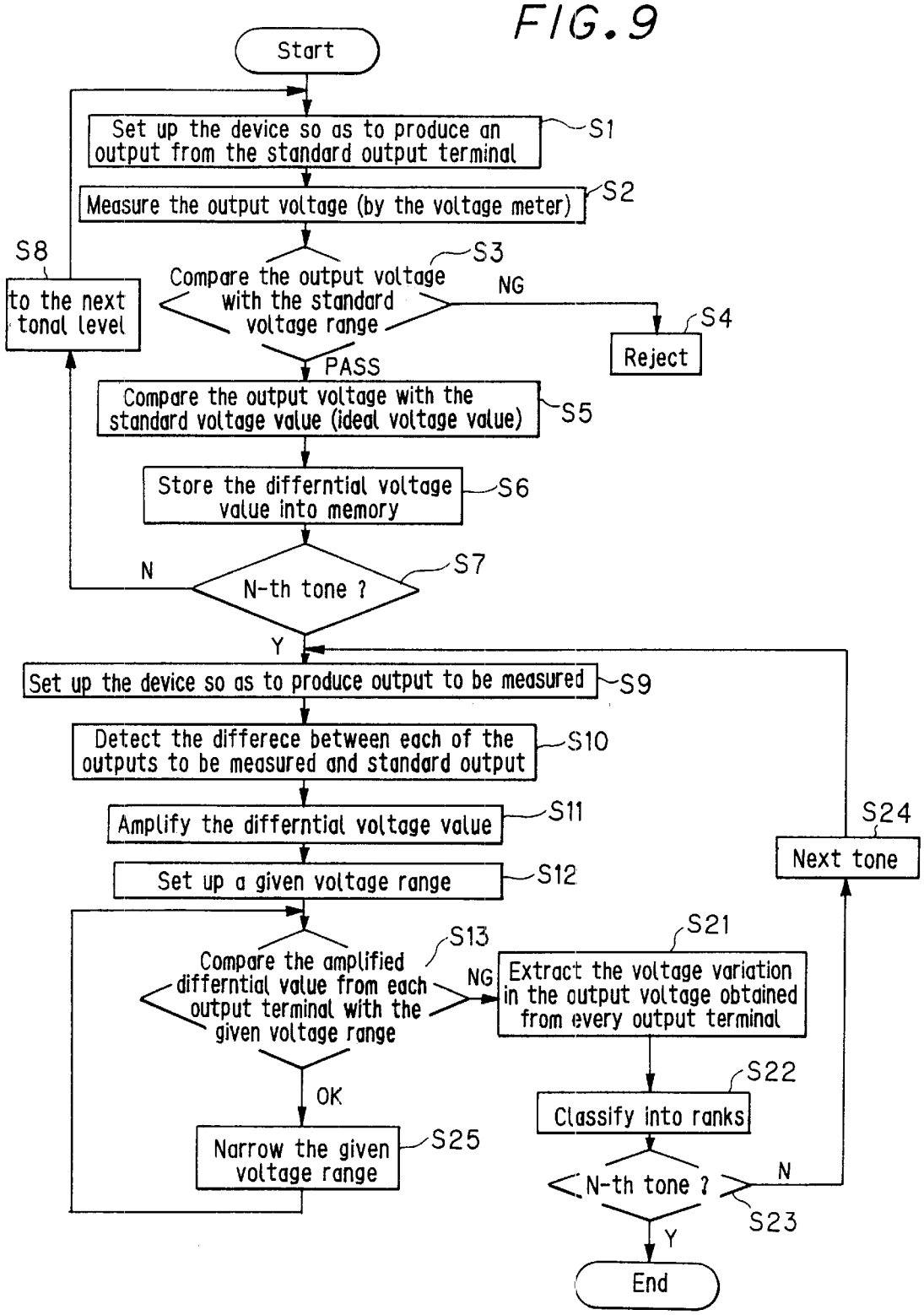
FIG. 9 is a flowchart showing the testing operation with the testing device of the third embodiment.

This testing operation will be described with reference to FIG. 9. FIG. 9 is a flowchart showing the testing operation of this testing device.

Steps S1 to S13 are the same as those illustrated in the first embodiment, so that the detailed description is omitted. When comparator 7 of tester 4 judges whether each differential voltage falls within the determination voltage range (S13) and AND circuit 14 produces the H-level output, which means that all the output voltages (amplified differential voltages) are judged to fall within the determination voltage range, the determination voltage range is made narrower by a predetermined unit to set up a second determination voltage range (S25). Then, the operation returns again to S13, where it is checked as to whether the amplified differential voltages fall within the determination voltage range. In this way, steps S13 and S25 are repeated as the determination voltage range is made narrower stepwise with decrements of 0.1 V, for example, until AND circuit 14 produces the L-level output (which means the device under test is rejected).

Upon the judgement at S13, when AND circuit 14 produces the L-level output, which means that any of the differential output voltages is judged to fall out of the above determination voltage range, the voltage variation of the output voltages from the output terminals is extracted (S21), and based on the obtained voltage variation within the determination voltage range, the LCD driver LSI is ranked (S22). Then, it is checked whether the operation is for the n-th tone (S23). If not, the operation returns to S13.

In the above description, the determination voltage range is varied by steps of 0.1 V, but if this varying unit is made smaller, it is possible to enhance the precision of measurement.

Programming the sequence of the testing process shown in FIG. 6 or FIG. 9 and storing it into a storage medium enables the CPU to execute the test based on the program.

As has been detailed heretofore, according to the testing device and testing method for a semiconductor integrated circuit of the present invention, since a special differential voltage value between the special output voltage value and the associated expected voltage value is computed so as to set up a determination voltage range based on the special differential voltage value, the determination voltage range based on which voltage comparison is to be made can be modified in accordance with the deviation, of the special output voltage output from the special D/A converter, from the associated expected voltage. Therefore, it is possible to effect the test for each tonal voltage with good precision.

Further, by virtue of the differential amplification of the differential amplifiers, it is possible to promote the precision of comparison by the comparing and determining means to a higher degree, which enables execution of highly precise testing.

According to the testing device and testing method for a semiconductor integrated circuit of the present invention, it is possible to provide a testing device which enables quick highly precise testing by using a comparing and determining means which effects simultaneous judgements of all the amplified differential voltages, in testing a semiconductor integrated circuit such as a LCD driver LSI which has been developed so as to handle a greater number of outputs and a greater number of tones. As a result it is possible to attain a remarkable reduction in the testing cost.

According to the testing device and testing method for a semiconductor integrated circuit of the present invention, since the upper and lower limit voltage values that specify the determination voltage range is set up by shifting the standard upper and lower limit voltage values by a fixed value that corresponds to the special differential voltage value, the determination voltage range based on which voltage comparison is to be made can be modified in conformity with the deviation, of the special output voltage output from the special D/A converter, from the associated expected voltage. Therefore, it is possible to effect the test for each tonal voltage with good precision.

According to the testing method for a semiconductor integrated circuit of the present invention, the quality of the semiconductor integrated circuit under test can be determined based on the determination voltage range which is set up by modifying the standard voltage range in accordance with the deviation from the expected voltage. Therefore, it is possible to effect quality determination precisely and efficiently.

According to the testing method for a semiconductor integrated circuit of the present invention, the width of the determination voltage range is constant, regardless of the tonal level being switched from one to another, there is no need to vary the determination voltage range of the comparing and determining means, and hence there is no need for complicated setup to be done.

According to the testing method for a semiconductor integrated circuit of the present invention, the width of the determination voltage range is narrowed stepwise until the device under test is determined as a defective. Thus, the judgement criteria of the comparing and determining means gradually are made to approach the idetal value, so this configuration is able to provide information about the quality of the semiconductor intetegrated circuit under test.

Further it is possible to classify the quality of each device based on the variation in output voltage, so that applications of the LCD panel to which the device is applied can be enlarged, thus making it possible to improve the production yield and reducing LCD drivers to fair price. Further, ranking or classification enables use of the devices, which would have been rejected as defectives, in some applications where large variations will not cuase problems and provides such devices at low cost.

What is claimed is:

1. A testing device for a semiconductor integrated circuit which incorporates a multiple number of D/A converters and outputs voltages from the D/A converters via associated output terminals, comprising:

a voltage measuring means for measuring the special output voltage corresponding to each tonal level output from a special output terminal of a special D/A converter and computing the difference between the special output voltage and the associated expected voltage as a special differential voltage;

differential amplifying means which, for each tone, receives the special output voltage and output voltages from the output terminals other than the special output terminal and calculates differential voltages and outputs the amplified differential voltages; and a comparing and determining means for determining whether the amplified differential voltages output from the differential amplifying means fall within a determination voltage range which is specified in accordance with the special differential voltage dependent on each tone.

2. The testing device for a semiconductor integrated circuit, according to claim 1, wherein the number of differential amplifying means is equal to the number of the output terminals other than the special output terminal, each of the differential amplifying means has an input for receiving a corresponding output voltage output from one of the output terminals other than the special output terminal and another input for receiving the special output voltage in common, and the comparing and determining means effects simultaneous judgement as to all the amplified differential voltages output from the differential amplifying means.

3. The testing device for a semiconductor integrated circuit, according to claim 1 or 2, wherein the upper and lower limit voltage values that specify the determination voltage range is set up by shifting the standard upper and lower limit voltage values which are given previously in conformity with the expected voltage value by a fixed value that corresponds to the special differential voltage value.

4. A testing method for a semiconductor integrated circuit which incorporates a multiple number of D/A converters and outputs voltages from the D/A converters via associated output terminals, comprising the steps of:

measuring the special output voltage corresponding to each tonal level output from a special output terminal of a special D/A converter and computing the difference between the special output voltage and the associated expected voltage as a special differential voltage;

for each tone, receiving the special output voltage and output voltages from the output terminals other than the special output terminal, calculating differential voltages and outputting the amplified differential voltages; and determining whether the amplified differential voltages output from the differential amplifying means fall within a determination voltage range which is specified in accordance with the special differential voltage dependent on each tone.

5. The testing method for a semiconductor integrated circuit, according to claim 4, wherein, even when the upper and lower limit values of the determination voltage range varies as the tonal level output from the terminals of the semiconductor integrated circuit is switched from one to another, the width of the determination voltage range is constant.

6. A testing method for a semiconductor integrated circuit which incorporates a multiple number of D/A converters and outputs voltages from the D/A converters via associated output terminals, comprising the steps of:

measuring the special output voltage corresponding to each tonal level output from a special output terminal of a special D/A converter and computing the difference between the special output voltage and the associated expected voltage as a special differential voltage;

for each tone, receiving the special output voltage and output voltages from the output terminals other than the special output terminal, calculating differential voltages and outputting the amplified differential voltages; and for determining whether the amplified differential voltages output from the differential amplifying means fall within a determination voltage range which is specified in accordance with the special differential voltage dependent on each tone, receiving the amplified differential voltages corresponding to associated output terminals in parallel and effecting simultaneous judgement as to whether all the amplified differential voltages fall within the determination voltage range.

7. The testing method for a semiconductor integrated circuit, according to claim 4 or 6, wherein the upper and lower limit voltage values that specify the determination voltage range are set up by shifting the standard upper and lower limit voltage values which are given previously in conformity with the expected voltage value by a fixed value that corresponds to the special differential voltage value.

8. The testing method for a semiconductor integrated circuit, according to claim 7, further comprising the steps of:

determining whether the special output voltage falls within the standard voltage range specified by the upper and lower standard voltage values;

regarding the semiconductor integrated circuit as a defective when the special output voltage falls out of the standard voltage range; and regarding the semiconductor integrated circuit as a non-defective if the amplified deferential voltages fall within the determination voltage range while regarding the semiconductor integrated circuit as a defective if any of the amplified deferential voltages falls out of the determination voltage range, in the case where the special differential voltage falls within the standard voltage range.

9. The testing method for a semiconductor integrated circuit, according to claim 8, wherein, even when the upper and lower limit values of the determination voltage range varies as the tonal level output from the terminals of the semiconductor integrated circuit is switched from one to another, the width of the determination voltage range is constant.

10. The testing method for a semiconductor integrated circuit, according to claim 8, wherein the width of the determination voltage range is narrowed stepwise until the device under test is determined as a defective.

11. The testing method for a semiconductor integrated circuit, according to claim 10, wherein semiconductor integrated circuits under test are classified into ranks, based on the variations of the output voltages in the determination voltage range when each device under test was determined as a defective.

12. The testing method for a semiconductor integrated circuit, according to claim 7, wherein, even when the upper and lower limit values of the determination voltage range varies as the tonal level output from the terminals of the semiconductor integrated circuit is switched from one to another, the width of the determination voltage range is constant.

13. The testing method for a semiconductor integrated circuit, according to claim 6, wherein, even when the upper and lower limit values of the determination voltage range varies as the tonal level output from the terminals of the semiconductor integrated circuit is switched from one to another, the width of the determination voltage range is constant.

14. A storage medium having a testing program stored therein for testing a semiconductor integrated circuit, which enables execution of a testing method for a semiconductor integrated circuit which incorporates a multiple number of D/A converters and outputs voltages from the D/A converters via associated output terminals, comprising the steps of:

measuring the special output voltage corresponding to each tonal level output from a special output terminal of a special D/A converter and computing the difference between the special output voltage and the associated expected voltage as a special differential voltage;

for each tone, receiving the special output voltage and output voltages from the output terminals other than the special output terminal, calculating differential voltages and outputting the amplified differential voltages; and determining whether the amplified differential voltages output from the differential amplifying means fall within a determination voltage range which is specified in accordance with the special differential voltage dependent on each tone.

15. The storage medium according to claim 14, having a testing program stored therein for testing a semiconductor integrated circuit, which enables execution of a testing method wherein, even when the upper and lower limit values of the determination voltage range varies as the tonal level output from the terminals of the semiconductor integrated circuit is switched from one to another, the width of the determination voltage range is constant.

16. A storage medium having a testing program stored therein for testing a semiconductor integrated circuit, which enables execution of a testing method for a semiconductor integrated circuit which incorporates a multiple number of D/A converters and outputs voltages from the D/A converters via associated output terminals, comprising the steps of:

measuring the special output voltage corresponding to each tonal level output from a special output terminal of a special D/A converter and computing the difference between the special output voltage and the associated expected voltage as a special differential voltage;

for each tone, receiving the special output voltage and output voltages from the output terminals other than the special output terminal, calculating differential voltages and outputting the amplified differential voltages; and for determining whether the amplified differential voltages output from the differential amplifying means fall within a determination voltage range which is specified in accordance with the special differential voltage dependent on each tone, receiving the amplified differential voltages corresponding to associated output terminals in parallel and effecting simultaneous judgement as to whether all the amplified differential voltages fall within the determination voltage range.

17. The storage medium according to claim 14 or 16, having a testing program stored therein for testing a semiconductor integrated circuit, which enables execution of a testing method wherein the upper and lower limit voltage values that specify the determination voltage range are set up by shifting the standard upper and lower limit voltage values which are given previously in conformity with the expected voltage value by a fixed value that corresponds to the special differential voltage value.

18. The storage medium according to claim 17, having a testing program stored therein for testing a semiconductor integrated circuit, which enables execution of the testing method, which further comprises the steps of:

determining whether the special output voltage falls within the standard voltage range specified by the upper and lower standard voltage values;

regarding the semiconductor integrated circuit as a defective when the special output voltage falls out of the standard voltage range; and regarding the semiconductor integrated circuit as a non-defective if the amplified deferential voltages fall within the determination voltage range while regarding the semiconductor integrated circuit as a defective if any of the amplified deferential voltages falls out of the determination voltage range, in the case where the special differential voltage falls within the standard voltage range.

19. The storage medium according to claim 18, having a testing program stored therein for testing a semiconductor integrated circuit, which enables execution of a testing method wherein, even when the upper and lower limit values of the determination voltage range varies as the tonal level output from the terminals of the semiconductor integrated circuit is switched from one to another, the width of the determination voltage range is constant.

20. The storage medium according to claim 18, having a testing program stored therein for testing a semiconductor integrated circuit, which enables execution of a testing method wherein the width of the determination voltage range is narrowed stepwise until the device under test is determined as a defective.

21. The storage medium according to claim 20, having a testing program stored therein for testing a semiconductor integrated circuit, which enables execution of a testing method wherein semiconductor integrated circuits under test are classified into ranks, based on the variations of the output voltages in the determination voltage range when each device under test was determined as a defective.

22. The storage medium according to claim 17, having a testing program stored therein for testing a semiconductor integrated circuit, which enables execution of a testing method wherein, even when the upper and lower limit values of the determination voltage range varies as the tonal level output from the terminals of the semiconductor integrated circuit is switched from one to another, the width of the determination voltage range is constant.

23. The storage medium according to claim 16, having a testing program stored therein for testing a semiconductor integrated circuit, which enables execution of a testing method wherein, even when the upper and lower limit values of the determination voltage range varies as the tonal level output from the terminals of the semiconductor integrated circuit is switched from one to another, the width of the determination voltage range is constant.

* * * * *